(12) United States Patent
Huang et al.

(10) Patent No.: US 10,446,688 B1
(45) Date of Patent: Oct. 15, 2019

(54) OXIDE SEMICONDUCTOR DEVICE AND MANUFACTURING METHOD THEREOF

(71) Applicant: UNITED MICROELECTRONICS CORP., Hsin-Chu (TW)

(72) Inventors: Jen-Po Huang, Tainan (TW); Chien-Ming Lai, Tainan (TW); Yen-Chen Chen, Tainan (TW); Sheng-Yao Huang, Kaohsiung (TW); Hui-Ling Chen, Kaohsiung (TW); Seng Wah Liau, Singapore (SG); Han Chuan Fang, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/190,090

(22) Filed: Nov. 13, 2018

(30) Foreign Application Priority Data

Oct. 18, 2018 (CN) .......................... 2018 1 1213723

(51) Int. Cl.
   *H01L 29/786* (2006.01)
   *H01L 29/417* (2006.01)
   *H01L 21/4757* (2006.01)
   *H01L 29/66* (2006.01)

(52) U.S. Cl.
   CPC .. *H01L 29/78606* (2013.01); *H01L 21/47573* (2013.01); *H01L 29/41733* (2013.01); *H01L 29/66969* (2013.01); *H01L 29/7869* (2013.01); *H01L 29/78648* (2013.01); *H01L 29/78696* (2013.01)

(58) Field of Classification Search
   CPC ........... H01L 29/7869; H01L 29/41733; H01L 29/66969; H01L 29/78606; H01L 29/78648; H01L 29/78696
   See application file for complete search history.

(56) References Cited

U.S. PATENT DOCUMENTS

| | | | | |
|---|---|---|---|---|
| 2008/0237875 | A1* | 10/2008 | Yamazaki | ......... H01L 29/41733 257/773 |
| 2012/0187396 | A1* | 7/2012 | Yamazaki | ......... H01L 29/66742 257/43 |
| 2014/0151688 | A1* | 6/2014 | Yamazaki | ........... H01L 29/7869 257/43 |
| 2014/0332800 | A1* | 11/2014 | Hanaoka | ............. H01L 29/7869 257/43 |
| 2014/0339547 | A1* | 11/2014 | Hondo | ................ H01L 29/7869 257/43 |
| 2017/0263774 | A1 | 9/2017 | Matsubayashi | |

* cited by examiner

*Primary Examiner* — Peniel M Gumedzoe
(74) *Attorney, Agent, or Firm* — Winston Hsu

(57) ABSTRACT

An oxide semiconductor device includes a substrate, a first patterned oxide semiconductor layer, a source electrode, a drain electrode, and a sidewall spacer. The first patterned oxide semiconductor layer is disposed on the substrate. The source electrode and the drain electrode are disposed on the first patterned oxide semiconductor layer. The sidewall spacer is disposed on a sidewall of the first patterned oxide semiconductor layer. The sidewall spacer may be used to improve the performance of blocking impurities from entering the first patterned oxide semiconductor layer via the sidewall, and the electrical performance and the reliability of the oxide semiconductor device may be enhanced accordingly.

8 Claims, 10 Drawing Sheets

OXIDE SEMICONDUCTOR DEVICE AND MANUFACTURING METHOD THEREOF

BACKGROUND OF THE INVENTION

1. Field of the Invention

The present invention relates to an oxide semiconductor device and a manufacturing method thereof, and more particularly, to an oxide semiconductor device including a sidewall spacer and a manufacturing method thereof.

2. Description of the Prior Art

Because of the properties of high mobility and low leakage current, oxide semiconductor materials such as indium gallium zinc oxide (IGZO) are widely applied in thin film transistors (TFTs) of display devices and field effect transistors (FETs) of integrated circuits. However, the semiconductor characteristics of the oxide semiconductor materials are directly dominated by the condition of oxygen vacancies in the oxide semiconductor materials, and the material properties of the oxide semiconductor layer tend to be influenced easily by environment substances, such as moisture, oxygen, and hydrogen. Accordingly, it is important to effectively block the environment substances from entering and influencing the oxide semiconductor material for improving the electrical stability and the product reliability of the oxide semiconductor device.

SUMMARY OF THE INVENTION

An oxide semiconductor device and a manufacturing method thereof are provided in the present invention. A sidewall spacer is disposed on a sidewall of a patterned oxide semiconductor layer, and the sidewall spacer is configured to enhance the performance of blocking impurities from entering the patterned oxide semiconductor layer via a sidewall of the patterned oxide semiconductor layer, and the electrical performance and the reliability of the oxide semiconductor device may be improved accordingly.

According to an embodiment of the present invention, an oxide semiconductor device is provided. The oxide semiconductor device includes a substrate, a first patterned oxide semiconductor layer, a source electrode, a drain electrode, and a sidewall spacer. The first patterned oxide semiconductor layer is disposed on the substrate. The source electrode and the drain electrode are disposed on the first patterned oxide semiconductor layer. The sidewall spacer is disposed on a sidewall of the first patterned oxide semiconductor layer.

According to an embodiment of the present invention, a manufacturing method of an oxide semiconductor device is provided. The manufacturing method includes the following steps. Firstly, a first patterned oxide semiconductor layer is formed on a substrate. A source electrode and a drain electrode are formed on the first patterned oxide semiconductor layer. A sidewall spacer is formed on a sidewall of the first patterned oxide semiconductor layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-10 are schematic drawings illustrating the manufacturing method of the oxide semiconductor device according to an embodiment of the present invention, wherein FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, FIG. 9 is a schematic drawing in a step subsequent to FIG. 8, and FIG. 10 is a schematic drawing in a step subsequent to FIG. 9.

DETAILED DESCRIPTION

Figure 1:
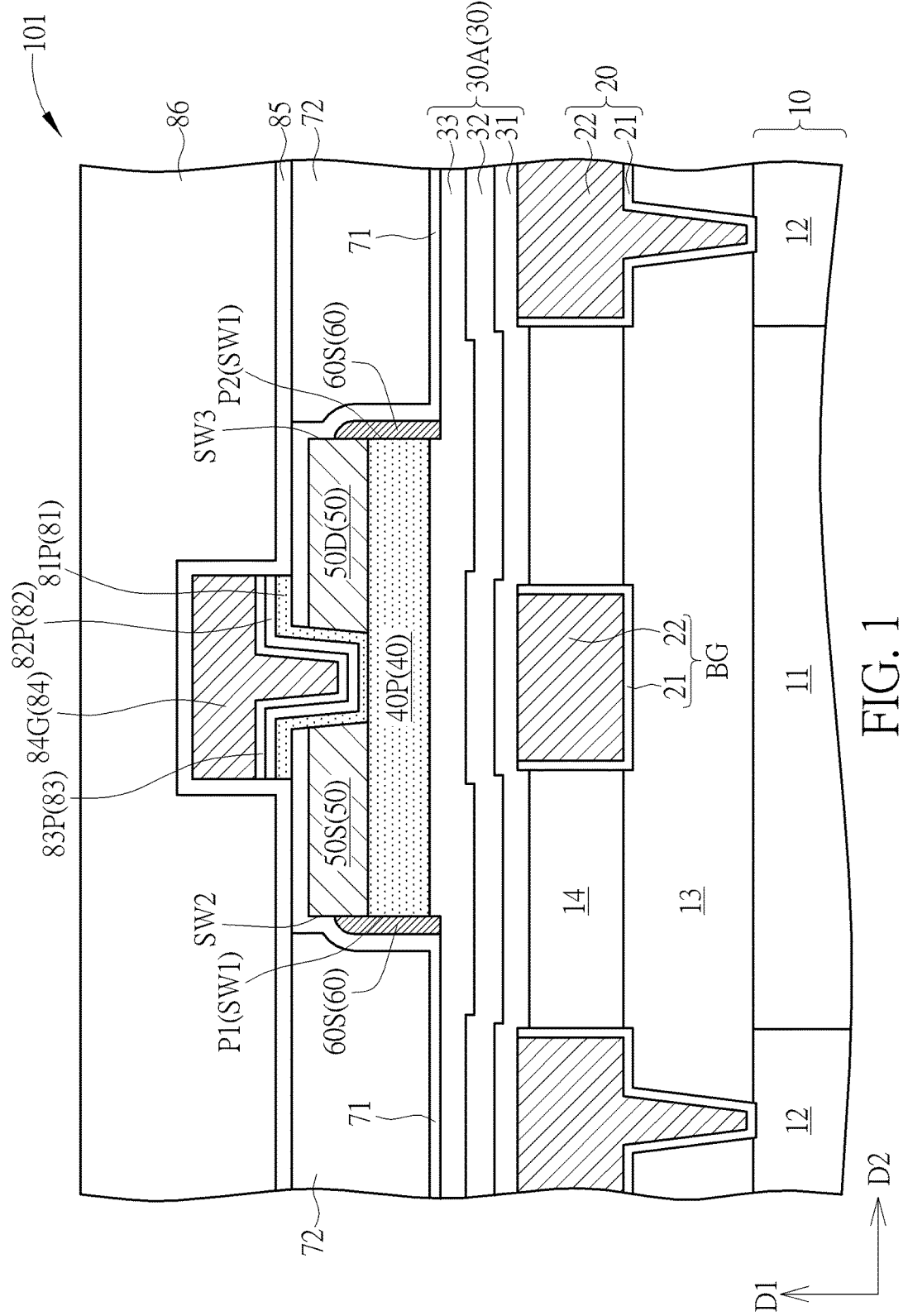
FIG. 1 is a schematic drawing illustrating an oxide semiconductor device according to an embodiment of the present invention.

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Additionally, terms, such as "bottom", "below", "above", "top", and the like, may be used herein for ease of description to describe one element or feature's relationship to another element(s) or feature(s) as illustrated in the figures. If the device in the figures in turned over, elements described as "above" can become "below". It will be understood that spatially relative terms are intended to encompass different orientations of the device in use or operation in addition to the orientations depicted in the figures The term "etch" is used herein to describe the process of patterning a material layer so that at least a portion of the material layer after etching is retained. For example, it is to be understood that the method of etching silicon involves patterning a photoresist layer over silicon and then removing silicon from the area that is not protected by the photoresist layer. Thus, during the etching process, the silicon protected by the area of the photoresist layer will remain. In another example, however, the term "etch" may also refer to a method that does not use a photoresist, but leaves at least a portion of the material layer after the etch process is complete.

The above description may be used to distinguish between "etching" and "removal". When "etching" a material layer, at least a portion of the material layer is retained after the end of the treatment. In contrast, when the material layer is "removed", substantially all the material layer is removed in the process. However, in some embodiments, "removal" is considered to be a broad term and may include etching.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Please refer to FIG. 1. FIG. 1 is a schematic drawing illustrating an oxide semiconductor device according to an embodiment of the present invention. As shown in FIG. 1, a semiconductor device 101 is provided in this embodiment. The semiconductor device 101 includes a substrate 10, a first patterned oxide semiconductor layer 40P, a source electrode 50S, a drain electrode 50D, and a sidewall spacer 60S. The first patterned oxide semiconductor layer 40P is disposed on the substrate 10. The source electrode 50S and the drain electrode 50D are disposed on the first patterned oxide semiconductor layer 40P. The sidewall spacer 60S is disposed on a sidewall (such as a first sidewall SW1 shown in FIG. 1) of the first patterned oxide semiconductor layer 40P. The sidewall spacer 60S may be used to enhance the performance of blocking environment impurities (such as moisture, hydrogen, and/or deuterium) from entering the first patterned oxide semiconductor layer 40P via the first sidewall SW1 of the first patterned oxide semiconductor layer 40P, and the electrical performance (such as electrical stability) and the product reliability of the oxide semiconductor device 101 may be improved accordingly, but not limited thereto.

In some embodiments, the substrate 10 may include a semiconductor substrate or a non-semiconductor substrate. The semiconductor substrate may include a silicon substrate, a silicon germanium substrate, or a silicon-on-insulator (SOI) substrate, and the non-semiconductor substrate may include a glass substrate, a plastic substrate, or a ceramic substrate, but not limited thereto. For example, when the substrate is a semiconductor substrate, a plurality of silicon-based field effect transistors (not shown) may be formed on the semiconductor substrate and a dielectric layer covering the silicon-based field effect transistors (such as a first dielectric layer 11 shown in FIG. 1) may be formed before the step of forming the first patterned oxide semiconductor layer 40P according to some considerations, but not limited thereto.

In some embodiments, the oxide semiconductor device 101 may further include a bottom gate electrode BG and a bottom gate dielectric layer 30. The bottom gate electrode BG may be disposed between the first patterned oxide semiconductor layer 40P and the substrate 10 in a thickness direction of the substrate 10 (such as a first direction D1 shown in FIG. 1), and the bottom gate dielectric layer 30 may be disposed between the first patterned oxide semiconductor layer 40P and the bottom gate electrode BG in the first direction D1. In some embodiments, the bottom gate electrode BG, the bottom gate dielectric layer 30, the first patterned oxide semiconductor layer 40P, the source electrode 50S, and the drain electrode 50D may form an oxide semiconductor transistor, but not limited thereto. In some embodiments, the oxide semiconductor device 101 may further include a top gate electrode 84G and a top gate dielectric layer 82. The top gate electrode 84G may be disposed on the first patterned oxide semiconductor layer 40P, the source electrode 50S, and the drain electrode 50D, and the top gate dielectric layer 82 may be disposed between the top gate electrode 84G and the first patterned oxide semiconductor layer 40P, but not limited thereto. In other words, the oxide semiconductor device 101 may include a dual gate oxide semiconductor transistor structure, but not limited thereto. In some embodiments, the oxide semiconductor device 101 may be a top gate oxide semiconductor transistor structure without the bottom gate electrode BG described above, or the oxide semiconductor device 101 may be a bottom gate oxide semiconductor transistor structure without the top gate electrode 84G described above.

In some embodiments, the bottom gate dielectric layer 30 may be an oxygen provider layer 30A disposed between the first patterned oxide semiconductor layer 40P and the substrate 10, and the bottom gate electrode BG is disposed between the oxygen provider layer 30A and the substrate 10. The oxygen provider layer 30A may be used provide oxygen to the first patterned oxide semiconductor layer 40P when the oxygen vacancies increase in the first patterned oxide semiconductor layer 40P for stabilizing the semiconductor characteristics of the first patterned oxide semiconductor layer 40P, but not limited thereto. Therefore, the oxygen concentration in the oxygen provider layer 30A is higher than the oxygen concentration in the first patterned oxide semiconductor layer 40P. Additionally, the oxygen provider layer 30A may also be used to keep the oxygen in the first patterned oxide semiconductor layer 40P from diffusing outward. The oxygen vacancies in the first patterned oxide semiconductor layer 40P may be controlled accordingly and the film quality of the first patterned oxide semiconductor layer 40P may not be degraded by the ambient condition and/or the manufacturing processes of the oxide semiconductor device 101. In some embodiments, the bottom gate dielectric layer 30 may include a single layer of a dielectric material or multiple layers of dielectric materials, and at least the dielectric material contacting the first patterned oxide semiconductor layer 40P may be an oxygen provider layer. For example, the bottom gate dielectric layer 30 may include a first bottom gate dielectric layer 31, a second bottom gate dielectric layer 32, and a third bottom gate dielectric layer 33 disposed and stacked sequentially in the first direction D1, and at least the third bottom gate dielectric layer 33 directly contacting the first patterned oxide semiconductor layer 40P may be an oxygen provider layer, but not limited thereto. In some embodiments, the second bottom gate dielectric layer 32 and/or the first bottom gate dielectric layer 31 may also be an oxygen provider layer.

In some embodiments, the sidewall spacer 60S may be disposed on the oxygen provider layer 30A, and the bottom and the sidewalls of the first patterned oxide semiconductor layer 40P may be completely covered by the sidewall spacer 60S and the oxygen provider layer 30A, but not limited thereto. It is worth noting that, in some embodiments, the sidewall spacer 60S may be formed by a material capable of blocking impurities from outside more effectively. For instance, the material of the sidewall spacer 60S may include but is not limited to silicon nitride. Compared with the oxygen provider layer 30A, the sidewall spacer 60S may have a poor ability to supply oxygen to the first patterned oxide semiconductor layer 40P relatively, but not limited thereto. In some embodiments, the material composition of the sidewall spacer 60S may be different from the material composition of the oxygen provider layer 30A, and the oxygen concentration in the sidewall spacer 60S may be lower than the oxygen concentration in the oxygen provider layer 30A. In other words, the oxygen provider layer 30A may be used to compensate for the inability of the sidewall spacer 60S to supply oxygen to the first patterned oxide semiconductor layer 40P. Therefore, the oxygen vacancies in the first patterned oxide semiconductor layer 40P can be controlled still when improving the protection performance at the sidewalls of the first patterned oxide semiconductor layer 40P.

In some embodiments, the sidewall spacer 60S may be further disposed on a sidewall of the source electrode 50S (such as a second sidewall SW2 shown in FIG. 1) and a sidewall of the drain electrode 50D (such as a third sidewall SW3 shown in FIG. 1) for ensuring that the first sidewall SW1 of the first patterned oxide semiconductor layer 40P may be completely covered by the sidewall spacer 60S, but not limited thereto. In some embodiments, the upper portion of the sidewall spacer 60S may directly contact the second sidewall SW2 of the source electrode 50S and the third sidewall SW3 of the drain electrode 50D, the middle portion of the sidewall spacer 60S may directly contact the first sidewall SW1 of the first patterned oxide semiconductor layer 40P, and the bottom portion of the sidewall spacer 60S may directly contact the oxygen provider layer 30A, but not limited thereto. In some embodiments, the topmost surface of the sidewall spacer 60S may be lower than the topmost surface of the source electrode 50S and the topmost surface of the drain electrode 50D in the thickness direction of the substrate 10 (e.g. the first direction D1), a part of the second sidewall SW2 of the source electrode 50S may not be covered by the sidewall spacer 60S, and a part of the third sidewall SW3 of the drain electrode 50D may not be covered by the sidewall spacer 60S, but not limited thereto. In some embodiments, the second sidewall SW2 of the source electrode 50S and the third sidewall SW3 of the drain electrode 50D may be completely covered by the sidewall spacer 60S according to some considerations.

In some embodiments, the second sidewall SW2 of the source electrode 50S and the third sidewall SW3 of the drain electrode 50D may be flush with the first sidewall SW1 of the first patterned oxide semiconductor layer 40P respectively. For example, the source electrode 50S and the drain electrode 50D may be disposed at two opposite sides of the top gate electrode 84G in a horizontal direction (such as a second direction D2 shown in FIG. 1) respectively, and the first sidewall SW1 of the first patterned oxide semiconductor layer 40P may have a first portion P1 and a second portion P2 located at two opposite sides of the first patterned oxide semiconductor layer 40P in the second direction D2 respectively. The second sidewall SW2 of the source electrode 50S away from the drain electrode 50D in the second direction D2 may be flush with the first portion P1 of the first sidewall SW1 in the first direction D1, and the third sidewall SW3 of the drain electrode 50D away from the source electrode 50S in the second direction D2 may be flush with the second portion P2 of the first sidewall SW1 in the first direction D1, but not limited thereto.

In some embodiments, the oxide semiconductor device 101 may further include a first protection layer 71, a first interlayer dielectric layer 72, a second patterned oxide semiconductor layer 81P, a second barrier layer 83, a second protection layer 85, and a second interlayer dielectric layer 86. The first protection layer 71 may be disposed conformally on the oxygen provider layer 30A, the sidewall spacer 60S, the source electrode 50S, and the drain electrode 50D. The first interlayer dielectric layer 72 may be disposed on a part of the first protection layer 71. The second patterned oxide semiconductor layer 81P may be disposed on the first protection layer 71, the source electrode 50S, the drain electrode 50D, and the first patterned oxide semiconductor layer 40P, and the top gate dielectric layer 82 may be disposed on the second patterned oxide semiconductor layer 81P. The second barrier layer 83 may be disposed between the top gate electrode 84G and the top gate dielectric layer 82, and the top gate electrode 84G may also be regarded as being disposed on the second patterned oxide semiconductor layer 81P. The second protection layer 85 may be disposed conformally on the first interlayer dielectric layer 72, the first protection layer 71, the second patterned oxide semiconductor layer 81P, and the top gate electrode 84G. The second protection layer 85 may cover the sidewalls of the top gate electrode 84G, the sidewalls of the second barrier layer 83, the sidewalls of the top gate dielectric layer 82, and the sidewalls of the second patterned oxide semiconductor layer 81P. The second interlayer dielectric layer 86 may be disposed on the second protection layer 85.

In some embodiments, the first protection layer 71 and the second protection layer 85 may respectively include an oxide dielectric material, such as aluminum oxide ($AlO_x$), or other suitable insulation materials, and the first interlayer dielectric layer 72 and the second interlayer dielectric layer 86 may respectively include silicon oxynitride, silicon oxide, or other suitable dielectric materials. In some embodiments, the material of the first protection layer 71 may be an oxide material having better protection performance and better oxygen supplying ability because a part of the second patterned oxide semiconductor layer 81P may be disposed on the first protection layer 71. In other words, the material composition of the first protection layer 71 may be different from the material composition of the sidewall spacer 60S. The oxygen supplying ability of the first protection layer 71 may be better than that of the sidewall spacer 60S, and the sidewall spacer 60S may have the ability to block external impurities better than the first protection layer 71.

In the oxide semiconductor device 101 of this embodiment, the sidewall spacer 60S may be disposed to improve the performance of blocking external impurities from entering the first patterned oxide semiconductor layer 40P from the first sidewall SW1, and the oxygen provider layer 30A may be disposed to enhance the performance of supplying oxygen to the first patterned oxide semiconductor layer 40P. The electrical performance and the product reliability of the oxide semiconductor device 101 may be enhanced accordingly.

Figure 2:
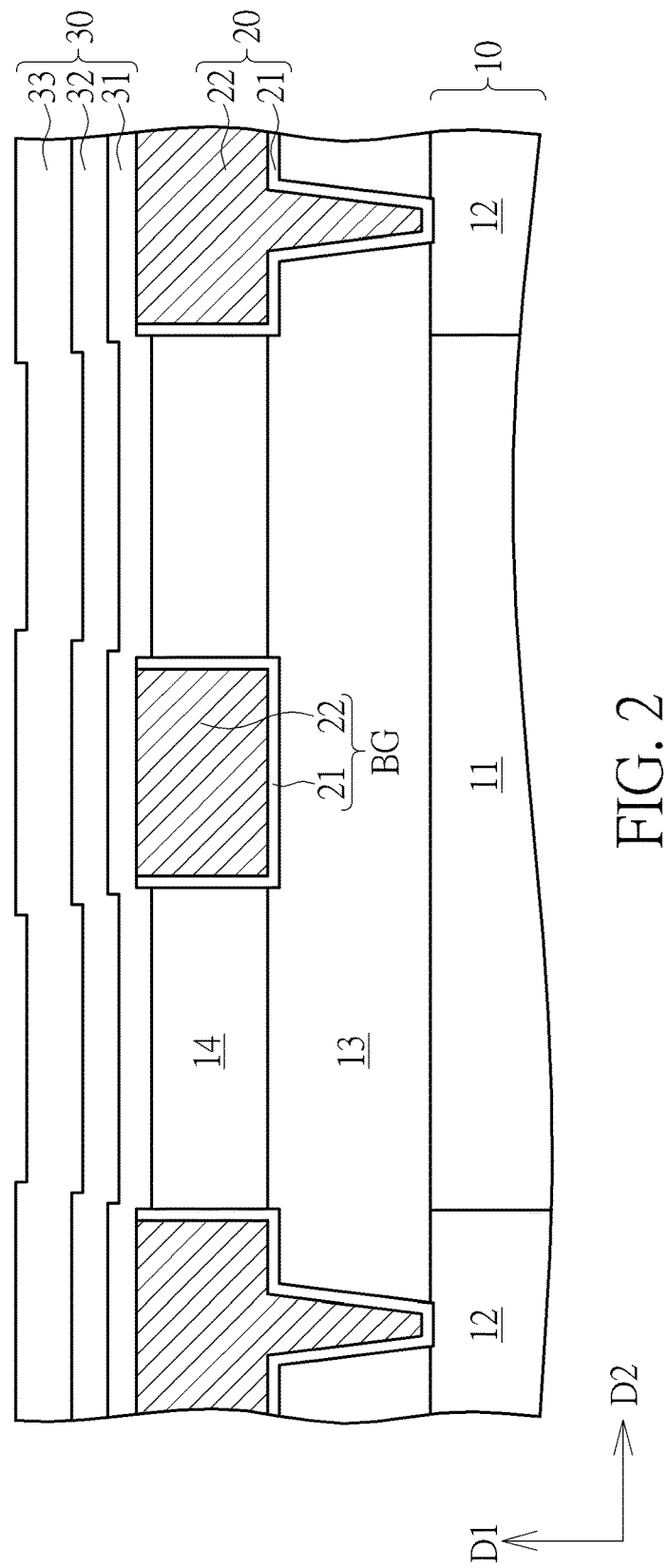
Figure 3:
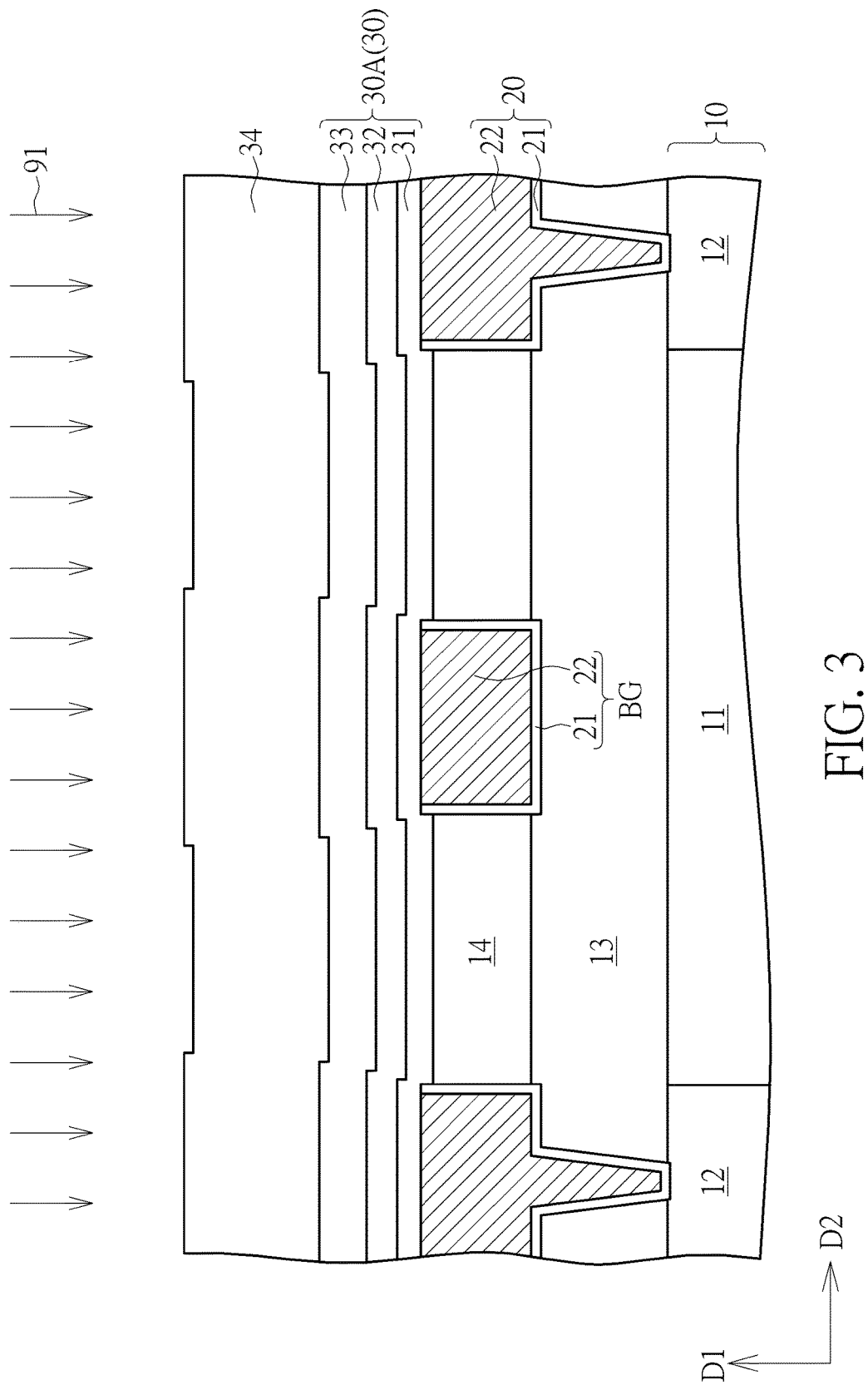
Figure 4:
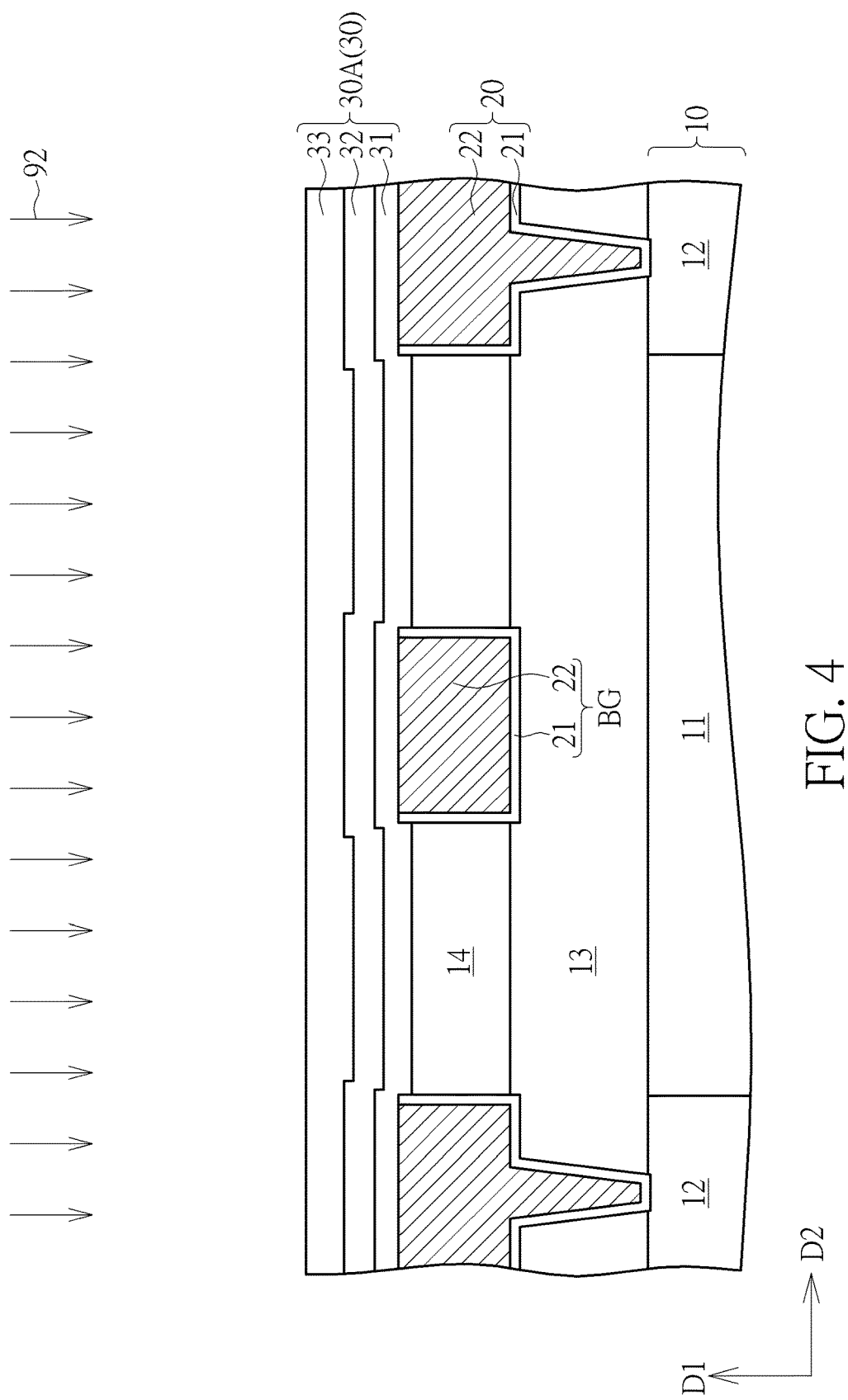
Figure 5:
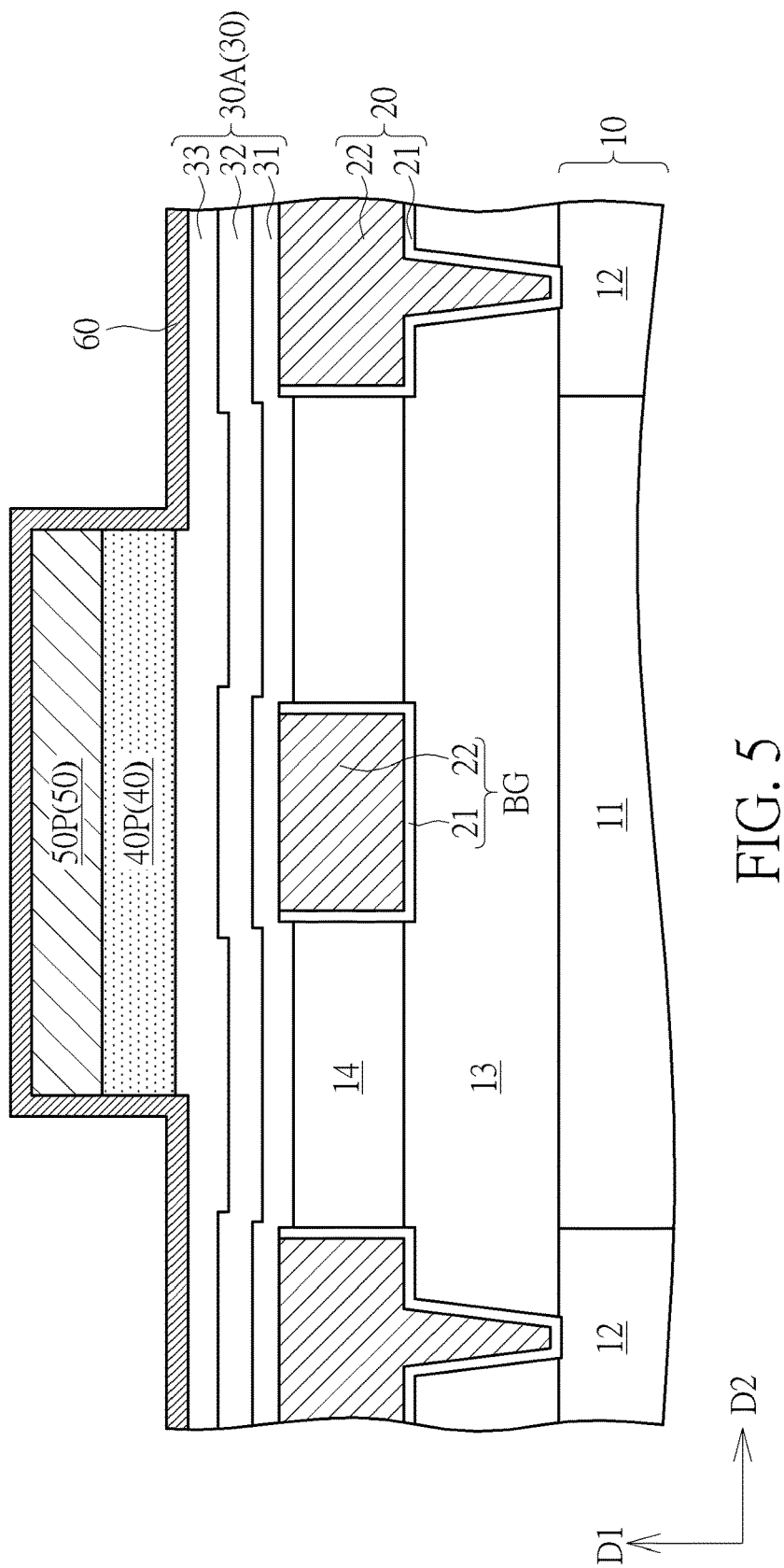
Figure 6:
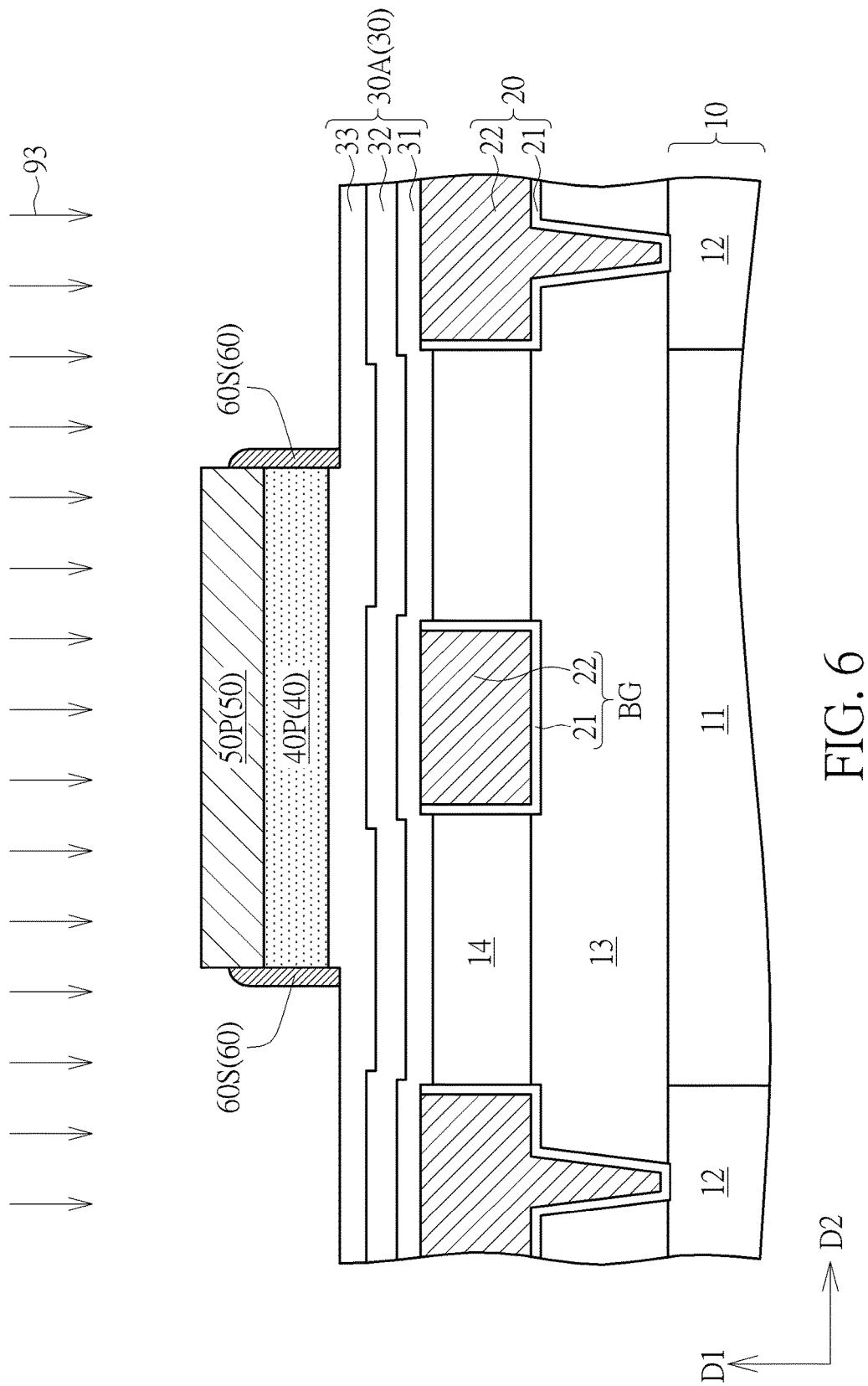
Figure 7:
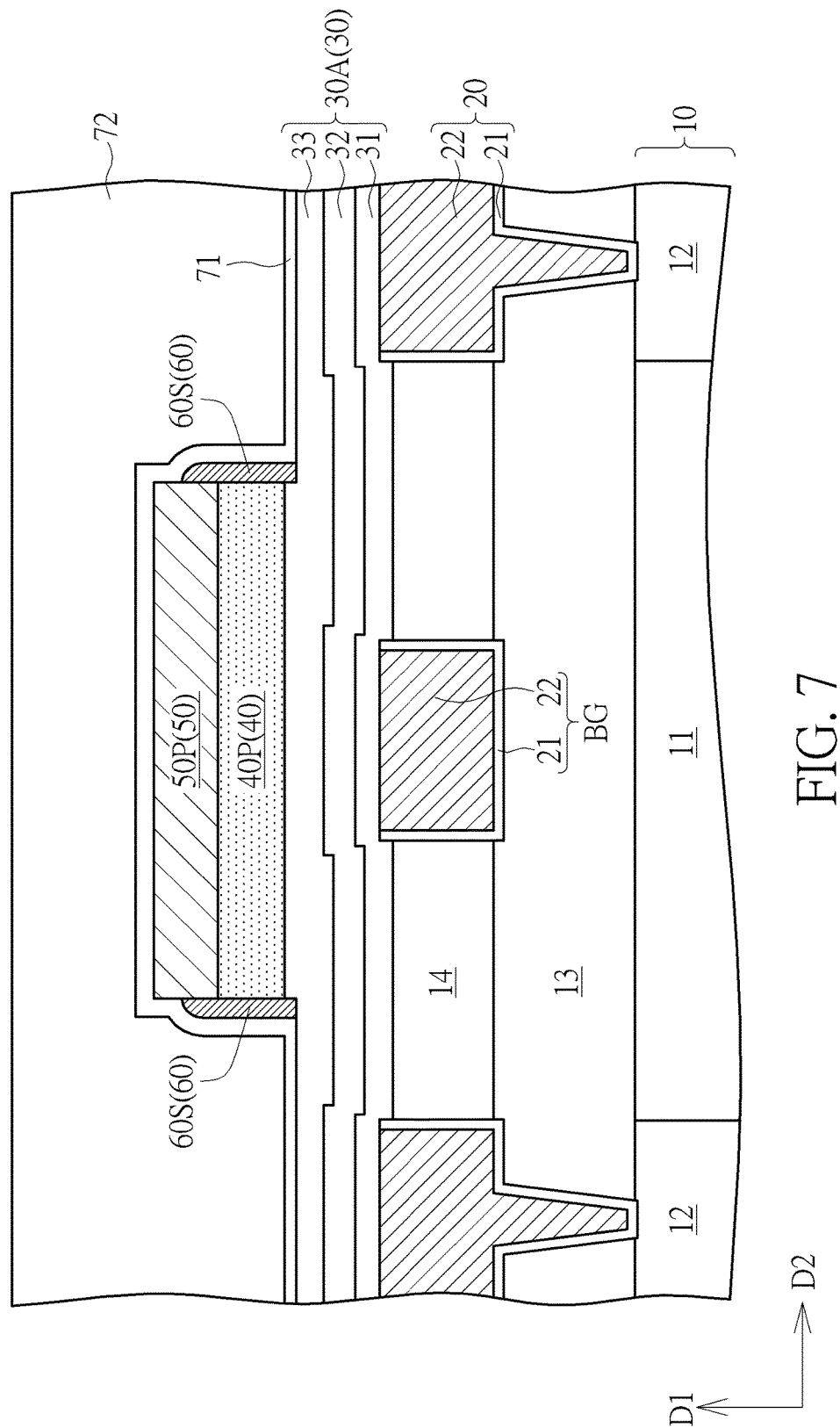
Figure 8:
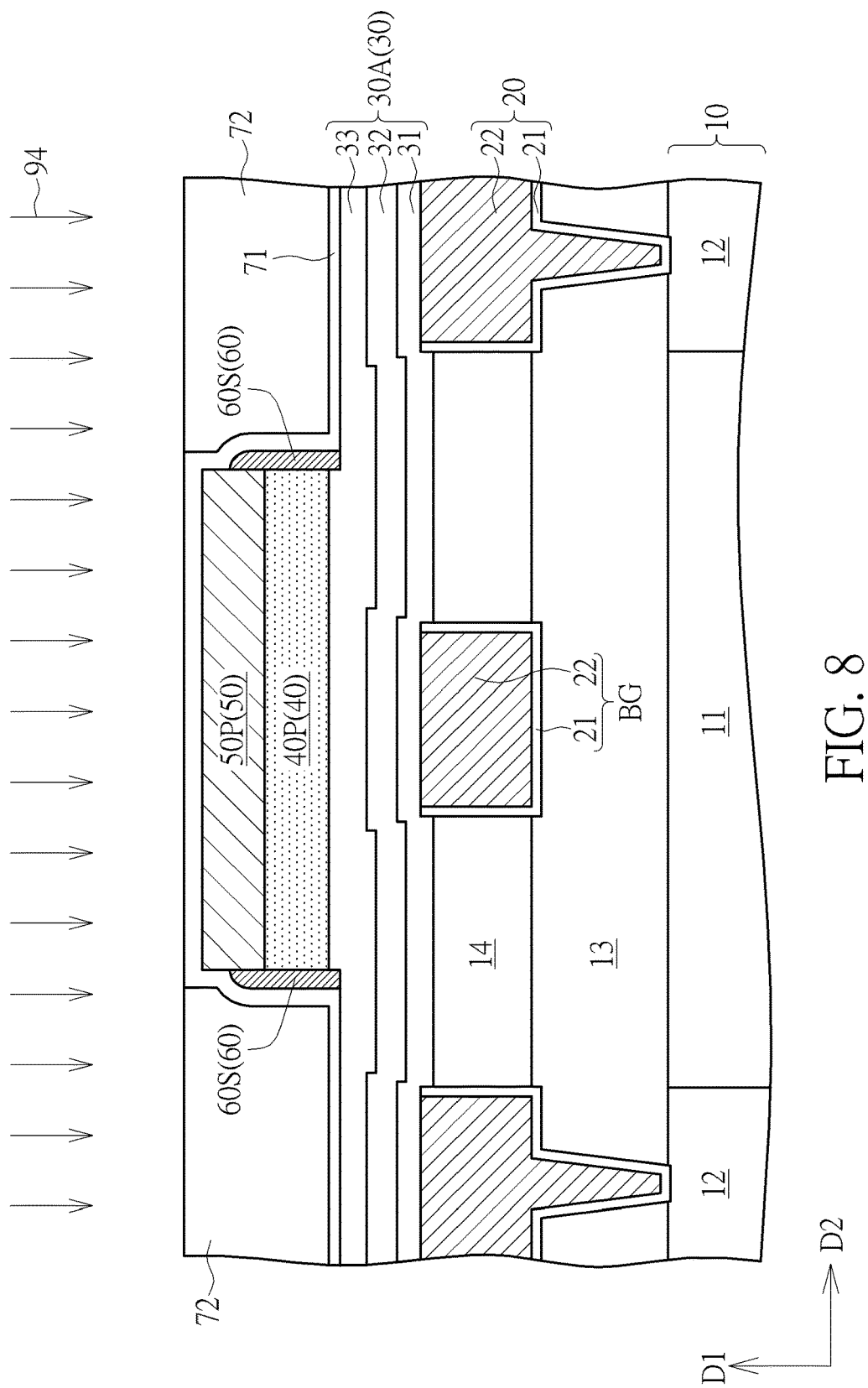
Figure 9:
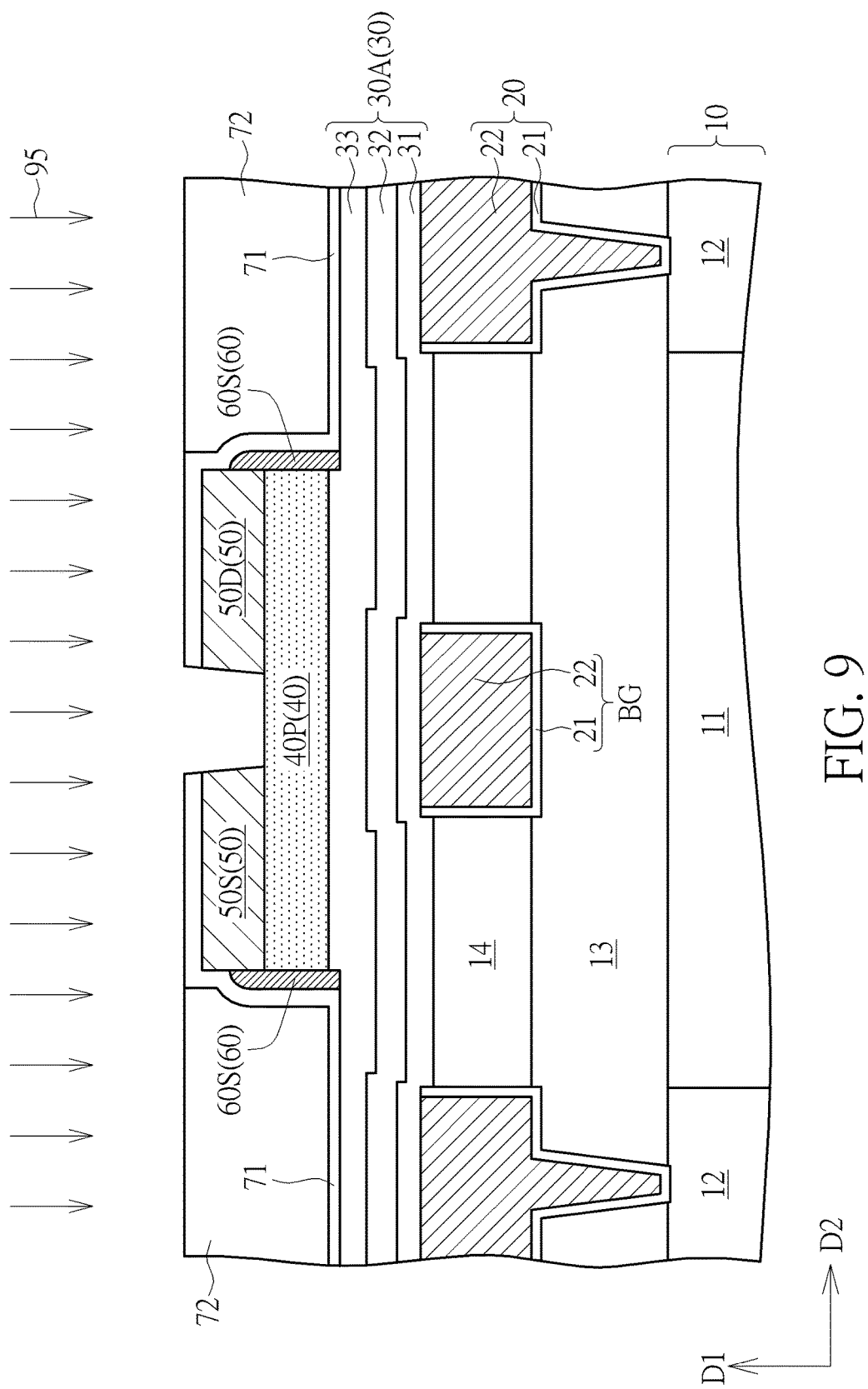
Figure 10:
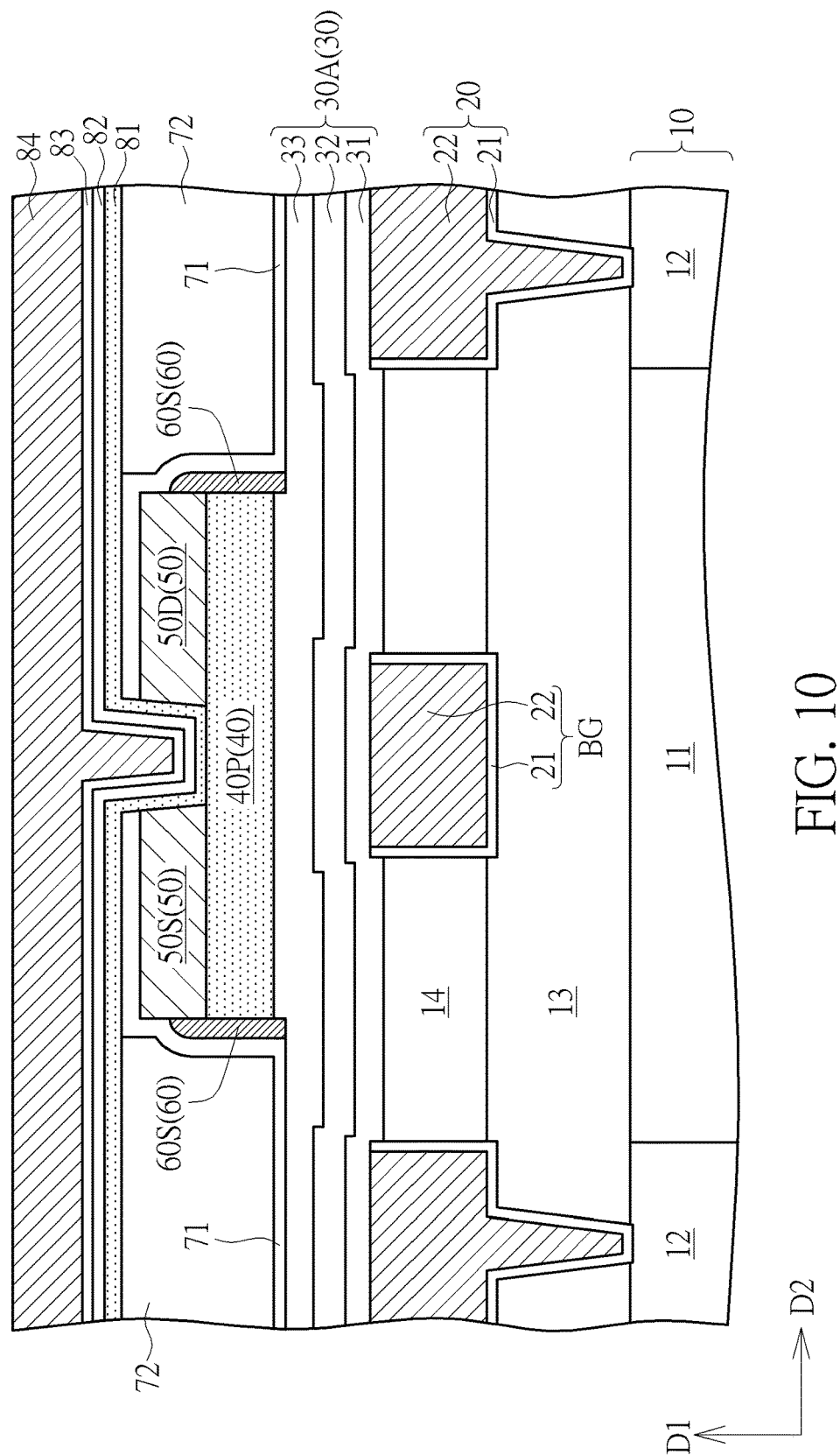

Please refer to FIGS. 2-10 and FIG. 1. FIGS. 2-10 are schematic drawings illustrating the manufacturing method of the oxide semiconductor device according to an embodiment of the present invention, wherein FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, FIG. 9 is a schematic drawing in a step subsequent to FIG. 8, FIG. 10 is a schematic drawing in a step subsequent to FIG. 9, and FIG. 1 may be regarded as a schematic drawing in a step subsequent to FIG. 10. As shown in FIG. 1, the manufacturing method of the oxide semiconductor device 101 in this embodiment may include the following steps. Firstly, the first patterned oxide semiconductor layer 40P is formed on the substrate 10. The source electrode 50S and the drain electrode 50D are formed on the first patterned oxide semiconductor layer 40P. The sidewall spacer 60S is formed on the first sidewall SW1 of the first patterned oxide semiconductor layer 40P.

Specifically, the manufacturing method of the oxide semiconductor device 101 in this embodiment may include but is not limited to the following steps. As shown in FIG. 2, a second dielectric layer 13 and a third dielectric layer 14 may be formed on the substrate 10, and the bottom gate electrode BG described above may be formed in the third dielectric layer 14. In some embodiments, the bottom gate electrode BG and some of the interconnection structure may be formed concurrently by the same process, but not limited thereto. For example, a first interconnection structure 12 may be formed in the first dielectric layer 11, a second interconnection structure 20 may be formed penetrating the second dielectric layer 13 and the third dielectric layer 14 above the first interconnection structure 12 for being connected with the first interconnection structure 12, and the bottom gate electrode BG and the second interconnection structure 20 may be formed concurrently by the same process, but not limited thereto. The bottom gate electrode BG may be formed by filling a recess penetrating the third dielectric layer 14 with a first barrier layer 21 and a first conductive layer 22, and the second interconnection structure 20 may be formed by filling a recess penetrating the third dielectric layer 14 and the second dielectric layer 13 with the first barrier layer 21 and the first conductive layer 22. The first barrier layer 21 may include titanium nitride, tantalum nitride, or other suitable barrier materials, and the first conductive layer 22 may include materials having lower electrical resistivity relatively, such as copper, aluminum, and tungsten, but not limited thereto. In some embodiments, the first dielectric layer 11, the second dielectric layer 13, and the third dielectric layer 14 may include silicon oxynitride, silicon oxide, or other suitable dielectric materials.

The bottom gate dielectric layer 30 described above may be formed after the step of forming the bottom gate electrode BG. In some embodiments, because of the etching selectivity in the manufacturing processes, the top surface of the second interconnection structure 20 and the top surface of the bottom gate electrode BG may be higher than the top surface of the third dielectric layer 14, and the top surface of the bottom gate dielectric layer 30 will be uneven especially when the bottom gate dielectric layer 30 is formed by multiple stacked material layers, and the planarization performance of the film forming process of each material layer is relatively worse. For example, the bottom gate dielectric layer 30 may be formed by stacking the first bottom gate dielectric layer 31, the second bottom gate dielectric layer 32, and the third bottom gate dielectric layer 33 sequentially in the first direction D1. The first bottom gate dielectric layer 31, the second bottom gate dielectric layer 32, and the third bottom gate dielectric layer 33 may respectively include silicon oxide, silicon oxynitride, high dielectric constant (high-k) materials, or other suitable dielectric materials. Additionally, in some embodiments, at least two of the first bottom gate dielectric layer 31, the second bottom gate dielectric layer 32, or the third bottom gate dielectric layer 33 may include different materials. For instance, the first bottom gate dielectric layer 31 may be a silicon oxide layer, the second bottom gate dielectric layer 32 may be an aluminum oxide layer, and the third bottom gate dielectric layer 33 may be a silicon oxide layer, but not limited thereto.

As shown in FIG. 3, in some embodiments, the step of forming the oxygen provider layer 30A described above may include but is not limited to forming a dielectric layer (such as the bottom gate dielectric layer 30 or the third bottom gate dielectric layer 33 in the bottom gate dielectric layer 30) on the substrate 10 and performing an oxygen doping process 91 to the dielectric layer. In some embodiments, the oxygen doping process 91 may include forming an auxiliary oxide layer 34 on the above-mentioned dielectric layer (such as the bottom gate dielectric layer 30 or the third bottom gate dielectric layer 33 in the bottom gate dielectric layer 30) and implanting oxygen into the bottom gate dielectric layer 30 by the process of forming the auxiliary oxide layer 34 (such as a sputtering process, an atomic layer deposition process, or other suitable processes). Therefore, at least the third bottom gate dielectric layer 33, which is the topmost layer in the bottom gate dielectric layer 30, may be converted into an oxygen provider layer, but not limited thereto. In some embodiments, the second bottom gate dielectric layer 32 and/or the first bottom gate dielectric layer 31 may also be converted into an oxygen provider layer. In other words, the oxygen provider layer 30A may be a bottom gate dielectric layer or include at least one bottom gate dielectric layer (such as the third bottom gate dielectric layer 33), and the bottom gate electrode BG may be formed on the substrate 10 before the step of forming the oxygen provider layer 30A. In some embodiments, the auxiliary oxide layer 34 may include aluminum oxide, hafnium oxide, lanthanum oxide, tantalum oxide, yttrium oxide, zirconium oxide, or other suitable oxide materials. In some embodiments, the oxygen doping process 91 may include an oxygen plasma treatment, an ozone oxidation treatment, or other suitable approaches directly implanting oxygen into the bottom gate dielectric layer 30 without forming the auxiliary oxide layer 34.

As shown in FIG. 3 and FIG. 4, after the step of forming the oxygen provider layer 30A, the auxiliary oxide layer 34 may be removed. In some embodiments, a first planarization process 92 may be performed for removing the auxiliary oxide layer 34 and planarizing the oxygen provider layer 30A. The first planarization process 92 may include a chemical mechanical polishing (CMP) process, an etching back process, or other suitable planarization approaches. Additionally, in some embodiments, a planarization process may be performed to the oxygen provider layer 30A after the step of removing the auxiliary oxide layer 34 according to some considerations.

Subsequently, as shown in FIG. 5, a first oxide semiconductor layer 40 is formed on the oxygen provider layer 30A, and a second conductive layer 50 is formed on the first oxide semiconductor layer 40. The second conductive layer 50 may include conductive metallic materials, such as tungsten, aluminum, copper, titanium aluminide, titanium, titanium nitride, tantalum, tantalum nitride, titanium aluminum oxide (TiAlO), or other suitable conductive materials. The first oxide semiconductor layer 40 may include II-VI compounds (such as zinc oxide, ZnO), II-VI compounds doped with alkaline-earth metals (such as zinc magnesium oxide, ZnMgO), II-VI compounds doped with IIIA compounds (such as indium gallium zinc oxide, IGZO), II-VI compounds doped with VA compounds (such as stannum stibium oxide, $SnSbO_2$), II-VI compounds doped with VIA compounds (such as zinc selenium oxide, ZnSeO), II-VI compounds doped with transition metals (such as zinc zirconium oxide, ZnZrO), or other oxide semiconductor materials composed of mixtures of the above-mentioned materials, but not limited thereto. Additionally, the first oxide semiconductor layer 40 may be a single layer or a multiple layer structure formed by the above-mentioned oxide semiconductor materials, and the crystalline condition of the first oxide semiconductor layer 40 is also not limited. For example, the first oxide semiconductor layer 40 may be amorphous IGZO (a-IGZO), crystal IGZO (c-IGZO), or C-axis aligned crystal IGZO (CAAC-IGZO). The first oxide semiconductor layer 40 may include a bottom layer and a top layer disposed on the bottom layer, and the top layer may include an oxide semiconductor layer having relatively lower contact resistance between the second conductive layer 50 and the oxide semiconductor layer in comparison with the bottom layer, but not limited thereto.

Subsequently, the second conductive layer 50 and the first oxide semiconductor layer 40 are patterned to form a patterned conductive layer 50P and the first patterned oxide semiconductor layer 40P respectively. Therefore, the first oxide semiconductor layer 40 may be formed on the oxygen provider layer 30A, and the oxygen provider layer 30A may be formed on the substrate 10 before the step of forming the first patterned oxide semiconductor layer 40P. It is worth noting that the roughness of the contact surface between the first patterned oxide semiconductor layer 40P and the oxygen provider layer 30A may be reduced by the abovementioned planarization process performed to the oxygen provider layer 30, and the reliability of the oxide semiconductor device may be improved accordingly. For instance, the breakdown electric field ($E_{BD}$) and/or the time-dependent dielectric breakdown (TDDB) may be improved, but not limited thereto. In some embodiments, the first patterned oxide semiconductor layer 40P and the patterned conductive layer 50P may be formed concurrently by the same patterning process, and a sidewall of the patterned conductive layer 50P may be substantially flush with the sidewall of the first patterned oxide semiconductor layer 40P, but not limited thereto. In some embodiments, the first patterned oxide semiconductor layer 40P and the patterned conductive layer 50P may also be formed by different processes respectively according to some considerations. Additionally, in some embodiments, a part of the oxygen provider layer 30A may be removed by the patterning process described above, and a portion of the oxygen provider layer 30A located below the first patterned oxide semiconductor layer 40P and contacting the first patterned oxide semiconductor layer 40P may be higher than other portions of the oxygen provider layer 30A in the first direction D1, but not limited thereto.

As shown in FIG. 5 and FIG. 6, the method of forming the sidewall spacer 60S may include forming a spacer material layer 60 conformally on the oxygen provider layer 30A, the first patterned oxide semiconductor layer 40P, and the patterned conductive layer 50P, and performing an etching process 93 to the spacer material layer 60, but the present invention is not limited to this. In some embodiments, the sidewall spacer 60S may be formed by other approaches. The etching process 93 may include an anisotropic etching process, such as a dry etching process, or other suitable etching approaches. In addition, the spacer material layer 60 may include silicon nitride or other suitable dielectric materials, and the spacer material layer 60 may be formed by a sputtering process or other film forming processes having less influence on the first patterned oxide semiconductor layer 40P, but not limited thereto. In some embodiments, the spacer material layer 60 located on the patterned conductive layer 50P in the first direction D1 and a part of the space material layer 60 located on the oxygen provider layer 50P may be removed by the etching process 93 for exposing the patterned conductive layer 50P and a part of the oxygen provider layer 30A, and the sidewall spacer 60S may be formed on the oxygen provider layer 30 and cover at least a part of the sidewall of the patterned conductive layer 50P.

As shown in FIG. 7, the first protection layer 71 may be formed conformally on the oxygen provider layer 30A, the sidewall spacer 60S, and the conductive layer 50 subsequently, and the first interlayer dielectric layer 72 may be formed on the first protection layer 71. As shown in FIG. 8, a second planarization process 94 may then be performed to the first interlayer dielectric layer 72 for removing a part of the first interlayer dielectric layer 72 and exposing the first protection layer 71 on the conductive layer 50. The second planarization process 94 may include a CMP process, an etching back process, or other suitable planarization approaches. As shown in FIG. 9, a patterning process 95 may be performed to the first protection layer 71 on the conductive layer 50 and the conductive layer 50 subsequently for forming the source electrode 50S and the drain electrode 50D. A part of the conductive layer 50 may be removed by the patterning process 95 for exposing the first patterned oxide semiconductor layer 40P between the source electrode 50S and the drain electrode 50D. In addition, the patterning process 95 may be performed after the step of forming the sidewall spacer 60S (such as the etching process 93 shown in FIG. 6 described above) and the step of removing apart of the first interlayer dielectric layer 72 (such as the second planarization process 94 shown in FIG. 8 described above), but not limited thereto. In some embodiments, the sidewall spacer 60S may be formed on the second sidewall SW2 of the source electrode 50S and the third sidewall SW3 of the drain electrode 50D, but not limited thereto.

As shown in FIG. 10, after the step of forming the source electrode 50S and the drain electrode 50D, a second oxide semiconductor layer 81 may be formed conformally on the first interlayer dielectric layer 72, the first protection layer 71, the source electrode 50S, the drain electrode 50D, and the first patterned oxide semiconductor layer 40P between the source electrode 50S and the drain electrode 50D. The top gate dielectric layer 82, the second barrier layer 83, and a third conductive layer 84 may be sequentially formed on the second oxide semiconductor layer 81. In some embodiments, the material of the second oxide semiconductor layer 81 may include oxide semiconductor materials similar to the first oxide semiconductor layer 40. The material of the top gate dielectric layer 82 may include silicon oxide, silicon oxynitride, high dielectric constant materials, or other suitable dielectric materials. The second barrier layer 83 may include titanium nitride, tantalum nitride, or other suitable barrier materials. The third conductive layer 84 may include conductive metallic materials, such as tungsten, aluminum, copper, titanium aluminide, titanium, titanium nitride, tantalum, tantalum nitride, titanium aluminum oxide, or other suitable conductive materials.

As shown in FIG. 10 and FIG. 1, the third conductive layer 84, the second barrier layer 83, the top gate dielectric layer 82, and the second oxide semiconductor layer 81 may then be patterned for forming the top gate electrode 84G, a patterned barrier layer 83P, a patterned top gate dielectric layer 82P, and the second patterned oxide semiconductor layer 81P. In other words, the second patterned oxide semiconductor layer 81P may be formed on the source electrode 50S, the drain electrode 50D, and the first patterned oxide semiconductor layer 40P, and the top gate electrode 84G may be formed on the second patterned oxide semiconductor layer 81P. In some embodiments, the top gate electrode 84G, the patterned barrier layer 83P, the patterned top gate dielectric layer 82P, and the second patterned oxide semiconductor layer 81P may be formed concurrently by the same patterning process, and the sidewall of the top gate electrode 84G, the sidewall of the patterned barrier layer 83P, the sidewall of the patterned top gate dielectric layer 82P, and the sidewall of the second patterned oxide semiconductor layer 81P may be substantially flush with one another, but not limited thereto. The second protection layer 85 may then be formed conformally on the top gate electrode 84G, the patterned barrier layer 83P, the patterned top gate dielectric layer 82P, the second patterned oxide semiconductor layer 81P, the first protection layer 71, and the first interlayer dielectric layer 72, and the second interlayer dielectric layer 86 may be formed on the second protection layer 85. In some embodiments, the second protection layer 85 may cover the top gate electrode 84G, the sidewall of the patterned barrier layer 83P, the sidewall of the patterned top gate dielectric layer 82P, and the sidewall of the second patterned oxide semiconductor layer 81P, and the second protection layer 85 may directly contact the first protection layer 71. Therefore, the top gate electrode 84G, the patterned barrier layer 83P, the patterned top gate dielectric layer 82P, and the second patterned oxide semiconductor layer 81P may be encompassed by the second protection layer 85 and the first protection layer 71 for enhancing the performance of blocking external impurities.

To summarize the above descriptions, in the oxide semiconductor device and the manufacturing method thereof according to the present invention, the sidewall spacer may be used to improve the performance of blocking external impurities from entering the first patterned oxide semiconductor layer via the sidewall of the first patterned oxide semiconductor layer, and the electrical performance and the product reliability of the oxide semiconductor device may be enhanced accordingly. Additionally, the oxygen provider layer located under the first patterned oxide semiconductor layer may be used to enhance the performance of supplying oxygen to the first patterned oxide semiconductor layer, and the roughness of the interface between the first patterned oxide semiconductor layer and the oxygen provider layer may be reduced by planarizing the oxygen provider layer for further improving the reliability of the oxide semiconductor device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An oxide semiconductor device, comprising:
   a substrate;
   a first patterned oxide semiconductor layer disposed on the substrate;
   a source electrode and a drain electrode disposed on the first patterned oxide semiconductor layer;
   a sidewall spacer disposed on a sidewall of the first patterned oxide semiconductor layer;
   a first protection layer conformally disposed on the sidewall spacer, the source electrode, and the drain electrode, wherein the first protection layer directly contacts a topmost surface of the sidewall spacer and a side surface of the sidewall spacer; and
   an oxygen provider layer disposed between the first patterned oxide semiconductor layer and the substrate, wherein the sidewall spacer is disposed on the oxygen provider layer, and the sidewall spacer is further disposed on a sidewall of a part of the oxygen provider layer disposed under the first patterned oxide semiconductor layer.

2. The oxide semiconductor device according to claim 1, wherein the sidewall spacer is further disposed on a sidewall of the source electrode and a sidewall of the drain electrode.

3. The oxide semiconductor device according to claim 2, wherein a topmost surface of the sidewall spacer is lower than a topmost surface of the source electrode and a topmost surface of the drain electrode in a thickness direction of the substrate.

4. The oxide semiconductor device according to claim 2, wherein the sidewall of the source electrode and the sidewall of the drain electrode are flush with the sidewall of the first patterned oxide semiconductor layer respectively.

5. The oxide semiconductor device according to claim 1, further comprising:
   a bottom gate electrode disposed between the oxygen provider layer and the substrate.

6. The oxide semiconductor device according to claim 1, wherein the first protection layer is further conformally disposed on the oxygen provider layer.

7. The oxide semiconductor device according to claim 6, wherein a material composition of the sidewall spacer is different from a material composition of the first protection layer.

8. The oxide semiconductor device according to claim 6, further comprising:
   a second patterned oxide semiconductor layer disposed on the source electrode, the drain electrode, and the first patterned oxide semiconductor layer;
   a top gate electrode disposed on the second patterned oxide semiconductor layer; and
   a second protection layer conformally disposed on the top gate electrode, the second patterned oxide semiconductor layer, and the first protection layer, wherein the second protection layer covers a sidewall of the second patterned oxide semiconductor layer, and a part of the first protection layer is disposed between the source electrode and the second patterned oxide semiconductor layer in a thickness direction of the substrate.

* * * * *